United States Patent
Geng et al.

(10) Patent No.: US 9,112,649 B2
(45) Date of Patent: Aug. 18, 2015

(54) METHOD AND APPARATUS FOR PREDICTING SIGNAL CHARACTERISTICS FOR A NONLINEAR POWER AMPLIFIER

(71) Applicant: QUALCOMM Incorporated, San Diego, CA (US)

(72) Inventors: Jifeng Geng, San Diego, CA (US); Daniel Fred Filipovic, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 12 days.

(21) Appl. No.: 13/649,994

(22) Filed: Oct. 11, 2012

(65) Prior Publication Data

US 2014/0105327 A1    Apr. 17, 2014

(51) Int. Cl.
H04L 27/36 (2006.01)
H04L 1/00 (2006.01)
H03F 1/02 (2006.01)
H03F 3/24 (2006.01)
H03F 1/32 (2006.01)

(52) U.S. Cl.
CPC .............. H04L 1/0033 (2013.01); H03F 1/025 (2013.01); H03F 1/3288 (2013.01); H03F 3/24 (2013.01); H04L 27/368 (2013.01); H03F 1/3247 (2013.01); H03F 2200/321 (2013.01); H03F 2200/336 (2013.01); Y02B 60/50 (2013.01)

(58) Field of Classification Search
CPC ............................ H03F 1/3247; H04L 27/368
USPC ........................................................ 375/297
See application file for complete search history.

(56) References Cited

U.S. PATENT DOCUMENTS

| | | | |
|---|---|---|---|
| 6,404,290 B1 * | 6/2002 | Voo .................................. 331/8 |
| 7,095,278 B2 | 8/2006 | Fuller et al. | |
| 7,906,868 B2 * | 3/2011 | Ferguson et al. ............... 307/31 |
| 8,000,659 B2 | 8/2011 | Nakamura et al. | |
| 2001/0005162 A1 * | 6/2001 | McCullough ................. 327/558 |
| 2005/0088226 A1 * | 4/2005 | Robinson et al. ............... 330/10 |
| 2005/0271054 A1 * | 12/2005 | Kang et al. .................... 370/389 |
| 2007/0146076 A1 | 6/2007 | Baba | |
| 2008/0080640 A1 * | 4/2008 | Rofougaran .................. 375/297 |
| 2009/0179491 A1 * | 7/2009 | Ferguson et al. ............... 307/31 |

(Continued)

FOREIGN PATENT DOCUMENTS

| EP | 1622256 A1 | 2/2006 |
|---|---|---|
| EP | 1811651 A1 | 7/2007 |

OTHER PUBLICATIONS

International Search Report and Written Opinion—PCT/US2013/064602—ISA/EPO—Dec. 13, 2013.

*Primary Examiner* — Santiago Garcia

(57) ABSTRACT

Aspects disclosed herein relate to predicting one or more signal characteristics to improve efficiency for a PA. A wireless communications device may be include a power amplifier and a processor that is associated with a signal prediction module. In an aspect, the processor may be a modem, a RF chip, etc. In one example, the wireless communications device may be configured to buffer one or more values associated with an input signal. The signal prediction module may be configured to predict a system response to at least a portion of the one or more buffered values, and generate a switcher control signal based on the system response. The signal prediction module may also generate a predicted supply voltage from the values associated with the input signal.

25 Claims, 6 Drawing Sheets

(56) References Cited

U.S. PATENT DOCUMENTS

| | | | |
|---|---|---|---|
| 2009/0302773 A1* | 12/2009 | Fischer et al. | 315/209 R |
| 2010/0283680 A1* | 11/2010 | Vishin et al. | 342/357.63 |
| 2010/0321115 A1 | 12/2010 | Mohajeri et al. | |
| 2011/0025422 A1 | 2/2011 | Marra et al. | |
| 2011/0103512 A1* | 5/2011 | Rofougaran | 375/297 |
| 2011/0136452 A1* | 6/2011 | Pratt et al. | 455/127.1 |
| 2013/0109442 A1* | 5/2013 | Dakshinamurthy et al. | 455/571 |
| 2013/0318283 A1* | 11/2013 | Small et al. | 711/103 |
| 2013/0343133 A1* | 12/2013 | Sharma et al. | 365/189.05 |
| 2014/0016725 A1* | 1/2014 | Peroulas et al. | 375/297 |
| 2014/0067326 A1* | 3/2014 | Alles | 702/184 |

* cited by examiner

METHOD AND APPARATUS FOR PREDICTING SIGNAL CHARACTERISTICS FOR A NONLINEAR POWER AMPLIFIER

BACKGROUND

1. Field

The disclosed aspects relate generally to enabling communications using a power amplifier (PA) and specifically to methods and systems for predicting a control signal for a PA switcher and/or a predicted supply voltage for a digital pre-distortion module associated with the PA.

2. Background

Current PA control apparatuses and methods are generally configured to use one or more combination of four PA control schemes. First, a battery direct scheme directly connects the battery to the PA. This may be efficient at times when max power is needed, but at lower powers efficiency drops rapidly because it's not necessary to use full battery voltage. Second, an average power tracking (APT) scheme uses a third party switcher between the batter and PA and uses an algorithm to change voltage between power control groups. Compared to the battery direct scheme, at lower powers efficiency falls off more gradually since PA voltage is correspondingly decreased. Third, a super APT (SAPT) scheme uses an algorithm to change voltage per various power control groups and also uses predistortion and adaptiveness to squeeze voltage to limits. Fourth, envelope tracking (ET) uses a separate chipset to track the signal envelope at high speed and high precision. This scheme may require PAs optimized for ET usage and may require an ET digital to analog converter (DAC) on the mobile station modem (MSM).

Further, Power amplifiers typically do not behave in a linear manner. More particularly, power amplifier distortion may compress or may expand the output signal swing of the amplifier. Signal detectors receiving and decoding the amplified signals typically do not operate in such a non-linear fashion. Therefore, it is typically necessary to linearize the output of the amplifier. One approach to such linearization is digital predistortion. Digital predistorters may be used with power amplifiers to invert the power amplifier distortion characteristics by expanding the compression regions and compressing the expansion regions in the power amplifier characteristics curve.

Both PA control schemes and digital predistortion schemes would benefit from knowledge of future signal characteristics. As such, a system and apparatus that predicting a control signal for a PA switcher and/or a predicted supply voltage for a digital pre-distortion module associated with a PA may be desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Various aspects are described in connection with predicting one or more signal characteristics to improve efficiency for a PA. A wireless communications device may be include a power amplifier and a processor that is associated with a signal prediction module. In an aspect, the processor may be a modem, a RF chip, etc. In one example, the wireless communications device may be configured to buffer one or more values associated with an input signal. The signal prediction module may be configured to predict a system response to at least a portion of the one or more buffered values, and generate a switcher control signal based on the system response. The signal prediction module may also generate a predicted supply voltage from the values associated with the input signal.

According to related aspects, a method provides a mechanism for predicting one or more signal characteristics to improve efficiency for a PA. The method can include buffering one or more values associated with an input signal. Further, the method can include predicting a system response to at least a portion of the one or more buffered values. Moreover, the method can include generating a switcher control signal based on the system response.

Another aspect relates to a communications apparatus. The wireless communications apparatus can include means for buffering one or more values associated with an input signal. Further, the apparatus can include means for predicting a system response to at least a portion of the one or more buffered values. Moreover, the apparatus can include means for generating a switcher control signal based on the system response.

Another aspect relates to a communications apparatus. The apparatus can include a buffer configured to store one or more values associated with an input signal, a reception module configured to provide the one or more values associated with the input signal to the buffer for storage, and a prediction module. The prediction module may be configured to predict a system response to at least a portion of the one or more buffered values. Further, the signal prediction module may be configured to generate a switcher control signal based on the system response.

Another aspect relates to a computer program product, which can have a computer-readable medium comprising code for buffering one or more values associated with an input signal. Further, the computer-readable medium can also include code for predicting a system response to at least a portion of the one or more buffered values. Moreover, the computer-readable medium can also include code for generating a switcher control signal based on the system response.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

A transmitter including a modem, a PA, and a PA switcher, coupled to the modem and PA, is described herein. The PA switcher may be configured to receive, from the modem, a switcher control signal on a control line, and switch among one or more voltage source paths and a ground voltage path to provide a supply voltage to low pass filter which may generate a smoothed supply voltage for the power amplifier. In an aspect, the switch control signal may indicate which path to use based on system response information. The transmitter may be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the transmitter in a wireless communication device is described below.

Figure 1:
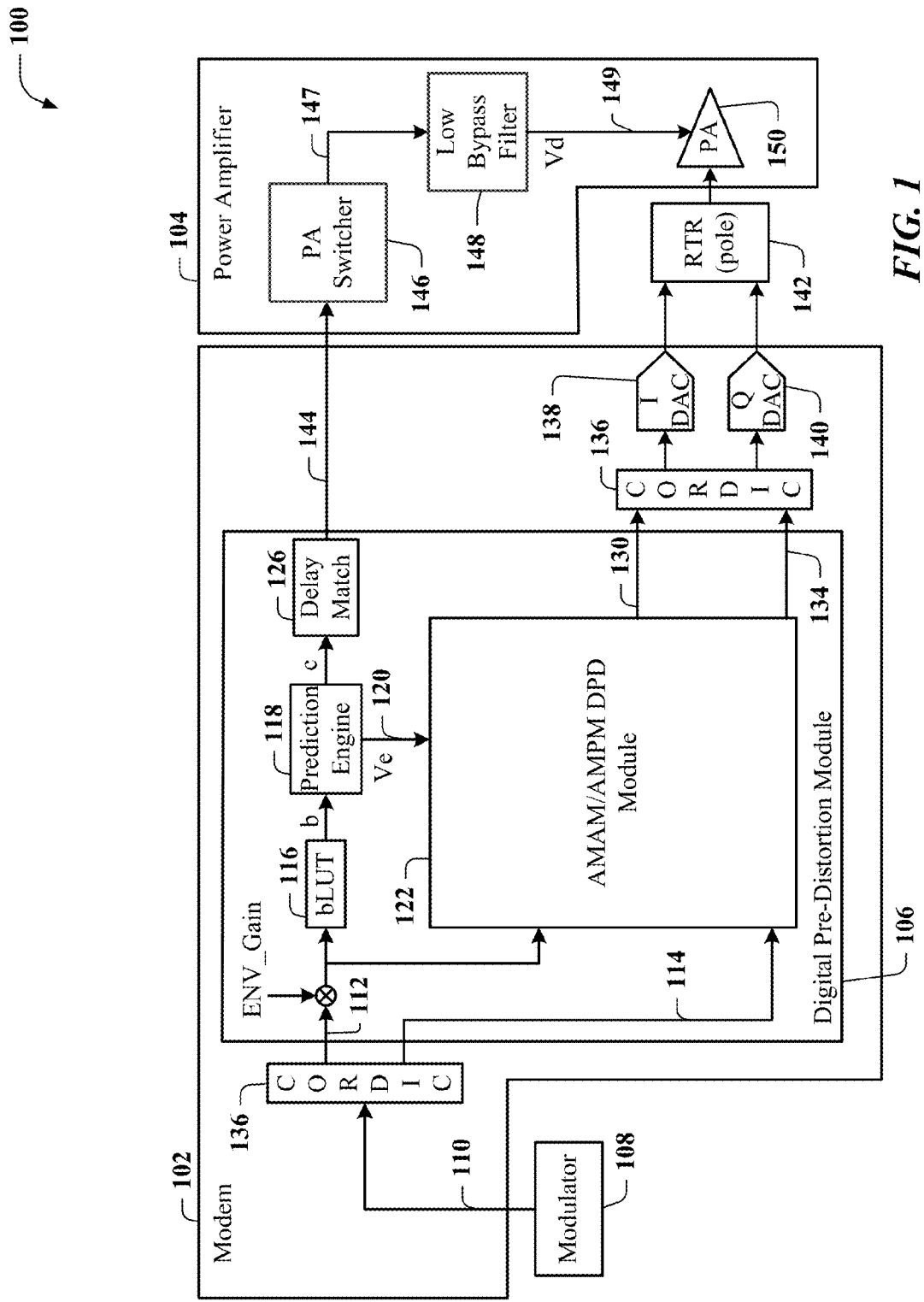
FIG. 1 is a functional block diagram of an example transmitter including a modem and a power amplifier, according to an aspect.

FIG. 1 illustrates a functional block diagram of an example transmitter 100 with modem 102 and PA component 104. Modem 102 may include a digital pre-distortion (DPD) module 106. PA component 104 may include PA switcher 146 that is configured to provide a supply voltage 147 to a low pass filter 148. Low pass filter 148 may process the supply voltage to generate a smoothed supply voltage 149 for PA 150.

Modem 102 may further include a coordinate rotation digital computer (CORDIC) component 136 that may be configured to receive a signal 110 from a modulator 108 and divide the signal 110 into an amplitude component 112 and a phase component 114. DPD module 106 may process amplitude component 112 and phase component 114 to produce a pre-distorted amplitude component 130 and a pre-distorted phase component 134. The pre-distorted amplitude 130 and phase 134 components may be processed by CORDIC 136 and converted to amplitude and phase components of an analog signal using "I" digital to analog converter 138 (I DAC) and "Q" DAC 140, respectively. The analogs signal components may be combined through a radio transceiver (RTR) 142 and provided to PA 150.

Within DPD module 106, the amplitude component 112 may be split, with a path (e.g., "b" path) leading to a prediction engine 118 and another path leading to an amplitude to amplitude (AMAM)/amplitude to phase (AMPM) DPD module 122.

In operation, the amplitude component 112 may be processed using AMAM/AMPM DPD module 122 to generate the pre-distorted amplitude component 130. In another aspect, the phase component 114 may be processed using AMAM/AMPM DPD module 122 to generate the pre-distorted phase component 134.

In another aspect, prior to being received by prediction engine 118, a gain associated with the amplitude component 112 ("b" path) may be modified using a LUT (e.g., bLUT) 116. Prediction engine 118 may then receive the modified amplitude component 112 and may determine an predicted voltage 120 for signal 110 and a control signal 144 for PA switcher 146. In an aspect, the received component 112 may include one or more state register values. In an aspect, prediction engine 118 may compare received component 112 (e.g., V(k)) and a bound value (b(k)) at time (t) and if any V(k) is within a tolerance (tol) of b(k), then prediction engine 118 may determine that a supply voltage control signal value 144 for time (t) equals "1" (e.g., the control signal 144 prompts PA switcher 146 to use a path with a voltage supply). By contrast, where V(k) at time t does not fall within the tolerance for any b(k) value, then a supply voltage control signal value 144 for time (t) may equal "0" (e.g., the control signal 144 prompts PA switcher 146 to use a path with a voltage ground). Further, in operation, the control signal 144 may pass through a delay match 126 (e.g., buffer) so as to match the arrival of the analog signal at the PA 150 with the smoothed supply voltage 14 from the low pass filter 148. In an aspect, a state register may be updated for a time (t) plus a time increment (dt) and the prediction engine 118 may predict a voltage (Ve) value 120 for a future time (V(k)=V(k+1)−h(k), Vd=V(1) when Vs(t)=0, and V(k)=V(k+1)−h(k)+h(k+1), Vd=V(1)+h(1) when Vs(t)=1).

Figure 2:
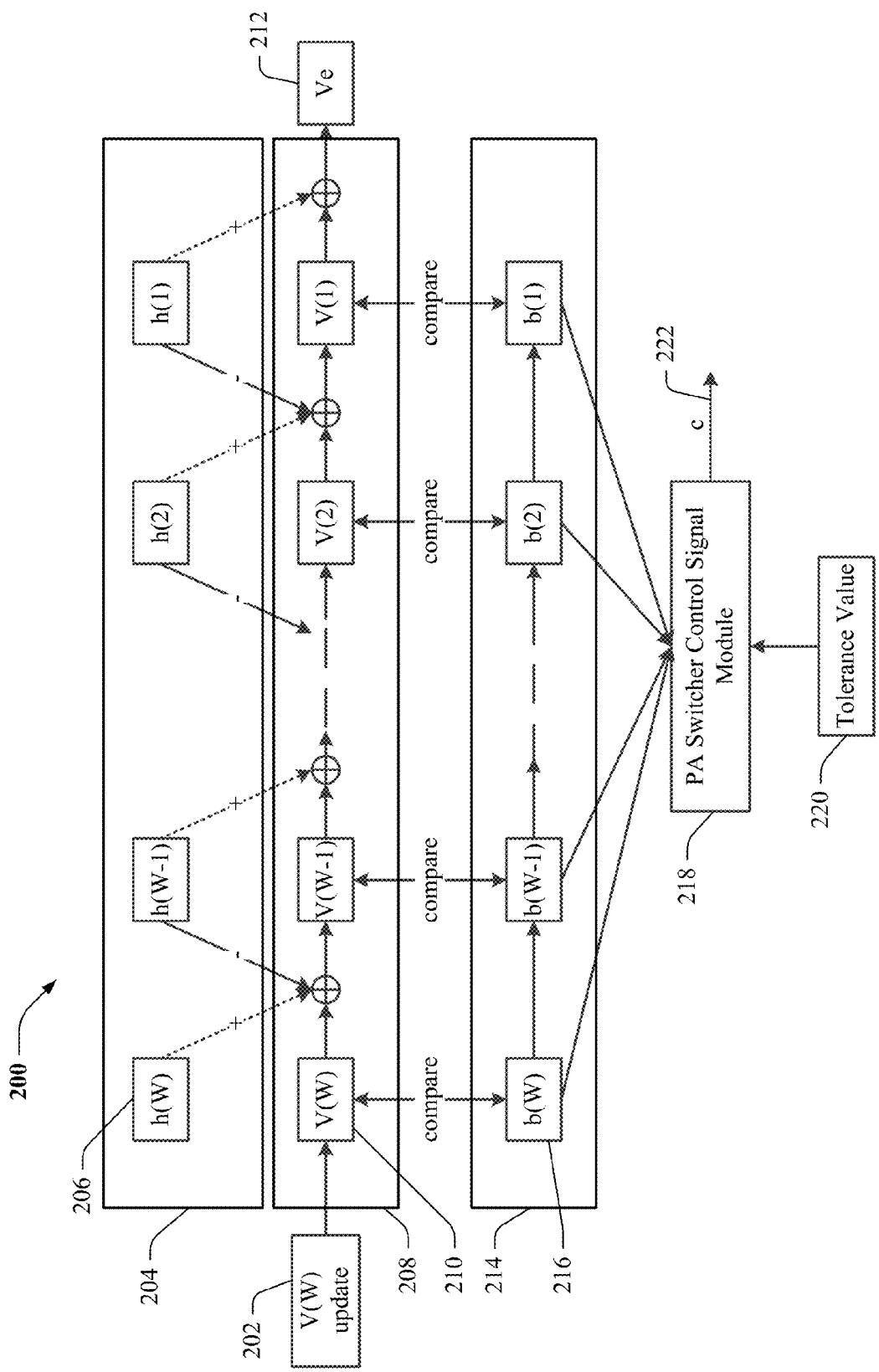
FIG. 2 is an example schematic diagram of a signal prediction module, according to an aspect.

FIG. 2 is a block diagram illustrating a signal prediction module 200, such as prediction engine 118, that is configured to generate projected supply voltage value(s) 212 and/or control signal(s) 222 for a predistortion module and/or power amplifier switcher associated with a nonlinear power amplifier.

Signal prediction module 200 may include an impulse function module 204, an input voltage sample module 208, a bound module 214, and a PA switcher control signal module 218. In an aspect, the impulse function module 204 may include one or more impulse functions 206 that may be applied (e.g., added and/or subtracted) to various input voltage samples 210. In such an aspect, signal prediction module 200 may predict a future supply voltage value 212 based on the application of the impulse functions 206 to the various input voltage samples 210. In an aspect, an impulse function 206 may provide a pre-calculated impulse response to a voltage supplied by a battery followed by ground voltage supply values (e.g., Vs=[Vbat, 0, 0, . . . , 0]). In one aspect, signal prediction module 200 may be configured to operate on "W" samples of a received input signal 202. In such an aspect, a modem, with which the signal prediction module 200 may be associated, may include a buffer (e.g., delay match 126) that may store "W" samples so as to allow signal prediction module 200 to generated an predicted supply voltage for a digital predistortion module (e.g., digital predistortion module 106). In an aspect, input voltage sample module 208 may be configured to receive at least a portion of an input signal 202. In such an aspect, input voltage sample module 208 may receive multiple samples 208 that may be modified by one or more impulse functions 206 to assist the signal prediction module 200 in generating an predicted voltage value 212. For example, impulse functions 206 may be used to modify each sample input signal value 210 to predict whether the signal, at a time associated with the signal sample 210, may be drop below and/or within a tolerance value 220 of a bound value 216. In another aspect, bound module 214 may include one or more bound values to be used in comparison with each of the input samples 210.

In operation, for a time "t" at least a portion of the "W" input voltage sample (e.g., V(W−1), V(W−2)…V(1)) may be modified through use of the various impulse functions "h" (e.g., V(W)+h(W−1) results in (V(W−1), etc.) and compared with a bound value "b" (b(W)). For each of the W samples is compared, PA switcher control signal module 218 determines if any of the samples are within a tolerance value 220 of the corresponding bound value 216. If PA switcher control signal module 218 determines any of the input voltage samples 210 are within a tolerance value 220 of their corresponding bound values 216, then a PA switcher control signal value 222 for time (t) may be set to "1" (e.g., the control signal prompts a switcher to use a path with a voltage supply). By contrast, if PA switcher control signal module 218 determines none of the input voltage samples 210 are within a tolerance value 220 of their corresponding bound values 216, then a PA switcher control signal value 222 for time (t) may be set to "0" (e.g., the control signal prompts a switcher to use a path with a voltage ground). Further, a state register associated with the input signal may be updated for a time (t) plus a time interment "dt" and signal prediction module 200 may project a supply voltage Vd value for a time "t" (e.g., (V(k)=V(k+1)−h(k), Vd=V(1) when Vs(t)=0, and V(k)=V(k+1)−h(k)+h(k+1), Vd=V(1)+h(1) when Vs(t)=1)).

Figure 3:
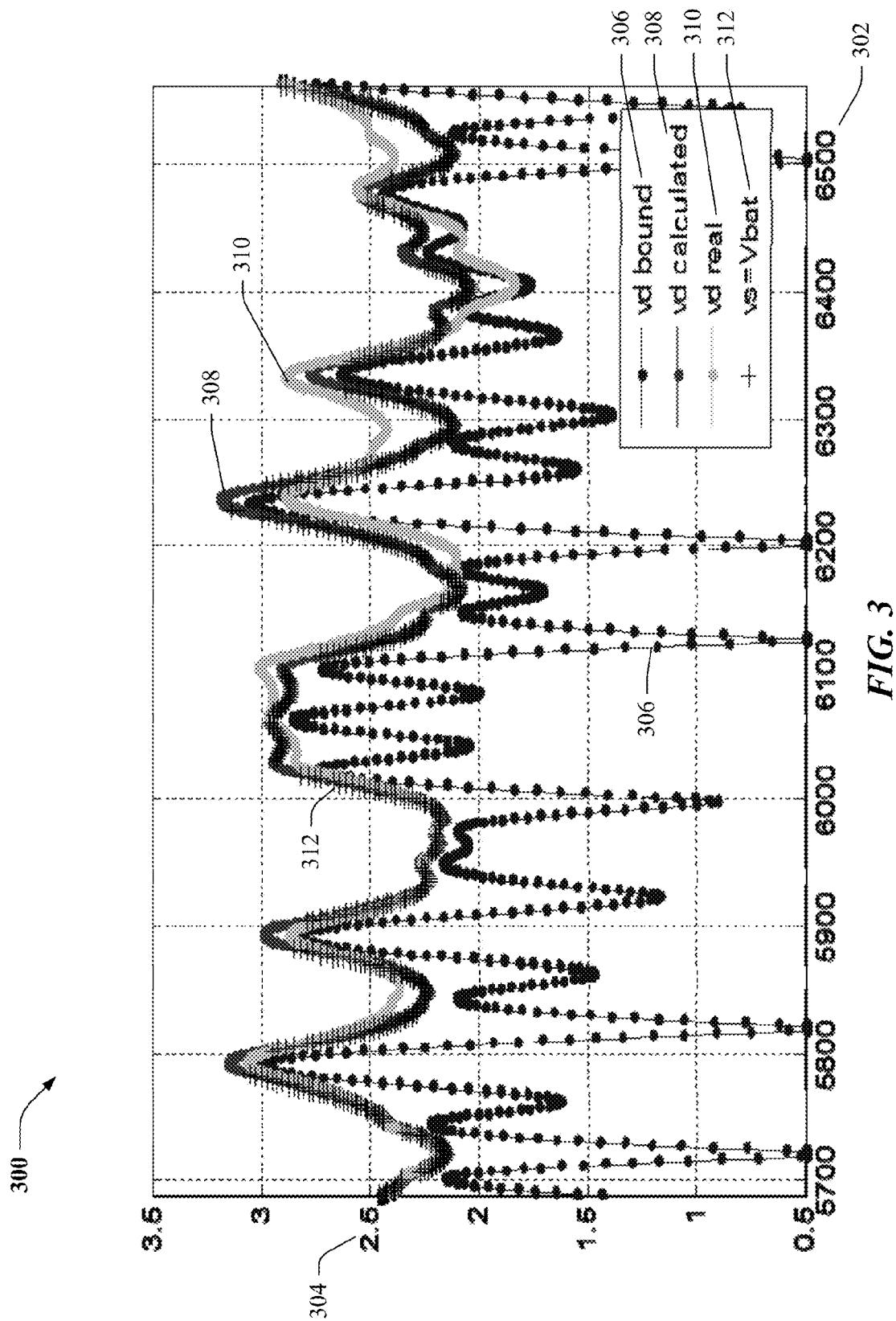
FIG. 3 is a graphical representation of a signal prediction module output, according to an aspect.

FIG. 3 illustrates a graphical representation 300 of a signal prediction module output, according to an aspect.

Graphical representation 300 includes an x-axis 302 representing time in milliseconds. Graphical representation 300 further includes a y-axis 304 voltage values for a signal. In the depicted graph, the output voltages are represented in Volts. Example, curves for a real supply voltage (Vd) 310, a Vd bound 306 are presented in graphical representation 300. In an operational aspect, a signal prediction module may use a Vd bound to calculate a supply voltage 308. Further, the calculated supply voltage 308 and/or the bound voltage value 310 may be used to generate a PA switcher control signal. This control signal may indicate times when the PA switcher is to use a path associated with a battery supply voltage. The "+" signs 312 indicates instances when a PA control signal would indicate to use the battery supply path.

As such, in an example aspect, a Vd bound 308, associated with a real supply voltage 310, may be used to assist in calculating an predicted supply voltage 308 and or a PA switcher control signal 312.

Figure 4:
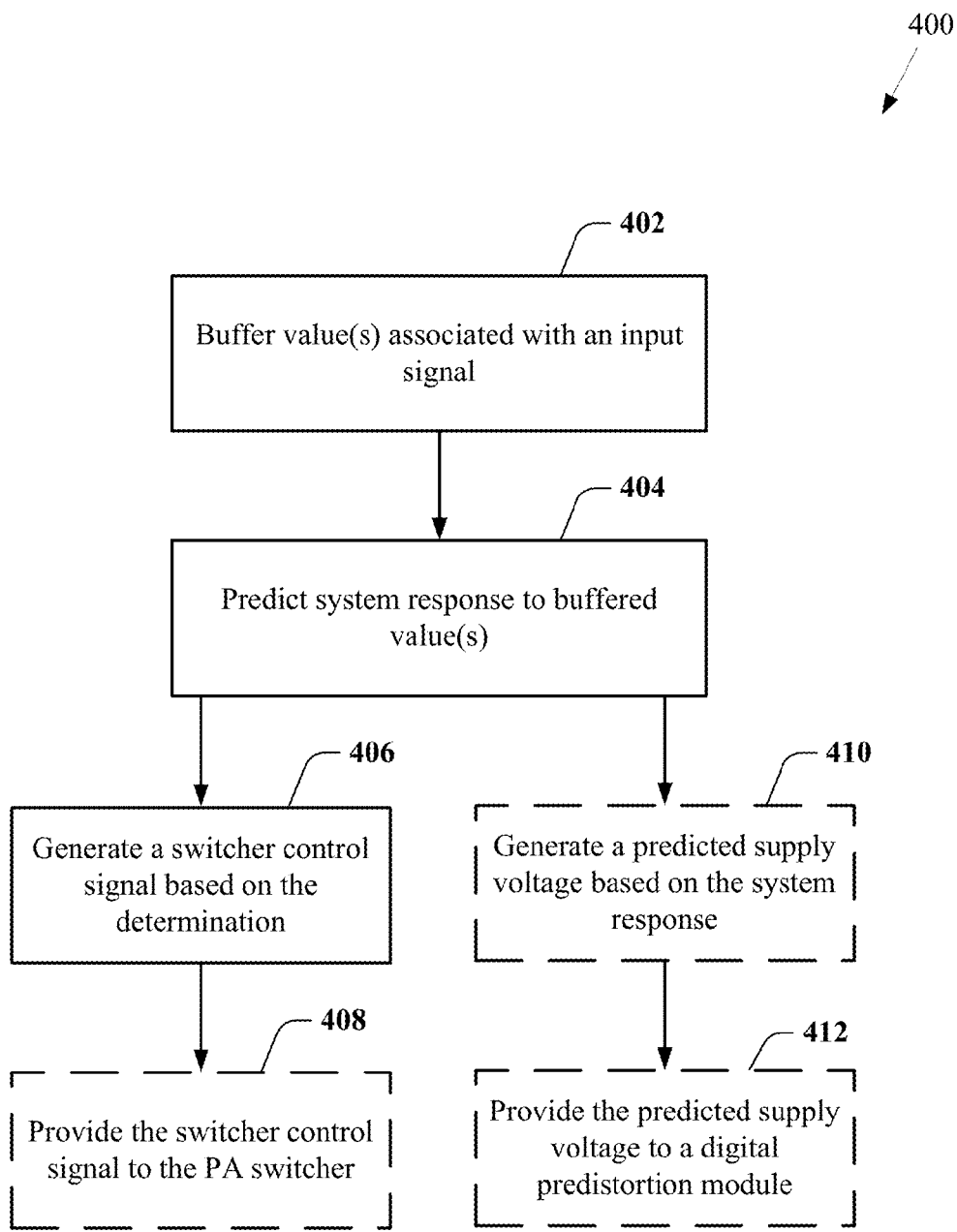
FIG. 4 is a flowchart diagram describing an example for predicting a control signal for a PA switcher and/or a predicted supply voltage for a digital pre-distortion module, according to an aspect.

FIG. 4 illustrates methodologies in accordance with various aspects of the presented subject matter. While the methodologies are shown and described as a series of acts or sequence steps for the purposes of simplicity of explanation, it is to be understood and appreciated that the claimed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

FIG. 4 illustrates a flowchart 400 describing a method for predicting a control signal for a PA switcher and/or a predicted supply voltage for a digital pre-distortion module.

At block 402, a signal prediction module may receive an input signal with amplitude and phase voltage components. In one aspect, the signal prediction module may store values (e.g., amplitude and/or phase) associated with the input signal in a buffer. As used herein, a state register values may be a voltage value at a time "t" (V(t)) as a first state, and the derivative of the voltage at time "t" (V'(t)) multiplied by a coefficient $$\frac{\sin\beta t}{\beta}$$

as a second state. In such an aspect, $\beta$ may be a component of an input signal with a state "s" root function characterized by $s_{1,2}=\alpha\pm j\beta$. In an aspect, one or more state register values may be associated with the input signal. In such an aspect, the state register values may include one or more coefficients that may assist with updating a state register for use during supply voltage predication. Further, the one or more coefficients may be further buffered to allow for online (e.g., real time) updating of the state register values.

At block 404, the signal prediction module may predict system response(s) to the received and buffered value(s). In an aspect, the signal prediction module may predict system response(s) by using an impulse function to generate projected supply voltage value(s). In an aspect, the signal prediction module may use different impulse functions with each of the first and second state functions. Further, as part of predicting the system response, the signal prediction module may compare each of the one or more projected supply voltage values with a corresponding bound value, and determine whether any projected supply voltage value of the one or more projected supply voltage values is within a tolerance threshold of the corresponding bound value.

At block 406, the signal prediction module may generate a switcher control signal based on the system response. In an aspect, the switcher control signal may include a digital bit value prompting a power amplifier switcher to use one or more voltage source paths. In another aspect, the switcher control signal may include a digital bit value prompting a power amplifier switcher to use a ground voltage path. For example, the PA switcher control signal may include a first value (e.g., "1") prompting the PA switcher to use a voltage source (e.g., battery) path when any of projected supply voltage values are within the tolerance threshold of their corresponding bound value, and/or a second value "0" prompting the switcher to use a ground source path when none of the projected supply voltage values are within the tolerance threshold of their corresponding bound value.

In an optional aspect, at block 408, the signal prediction module may provide the generated switcher control signal to a PA switcher.

In another optional aspect, at block 410, the signal prediction module may generate a predicted supply voltage from the one or more project supply voltage values. In such an aspect, the predicted supply voltage may be used by a predistortion module. In one aspect, the buffer may be large enough to allow W consecutive sample values to be stored. In such an aspect, the W consecutive sample values may be used to generate projected supply voltage value(s). In another aspect, the buffer may be large enough to allow N check-points associated with the input signal to generate the projected supply voltage value(s).

In such an optional aspect, at block 412, the signal prediction module may provide the generated predicted supply voltage to a predistortion module.

Figure 5:
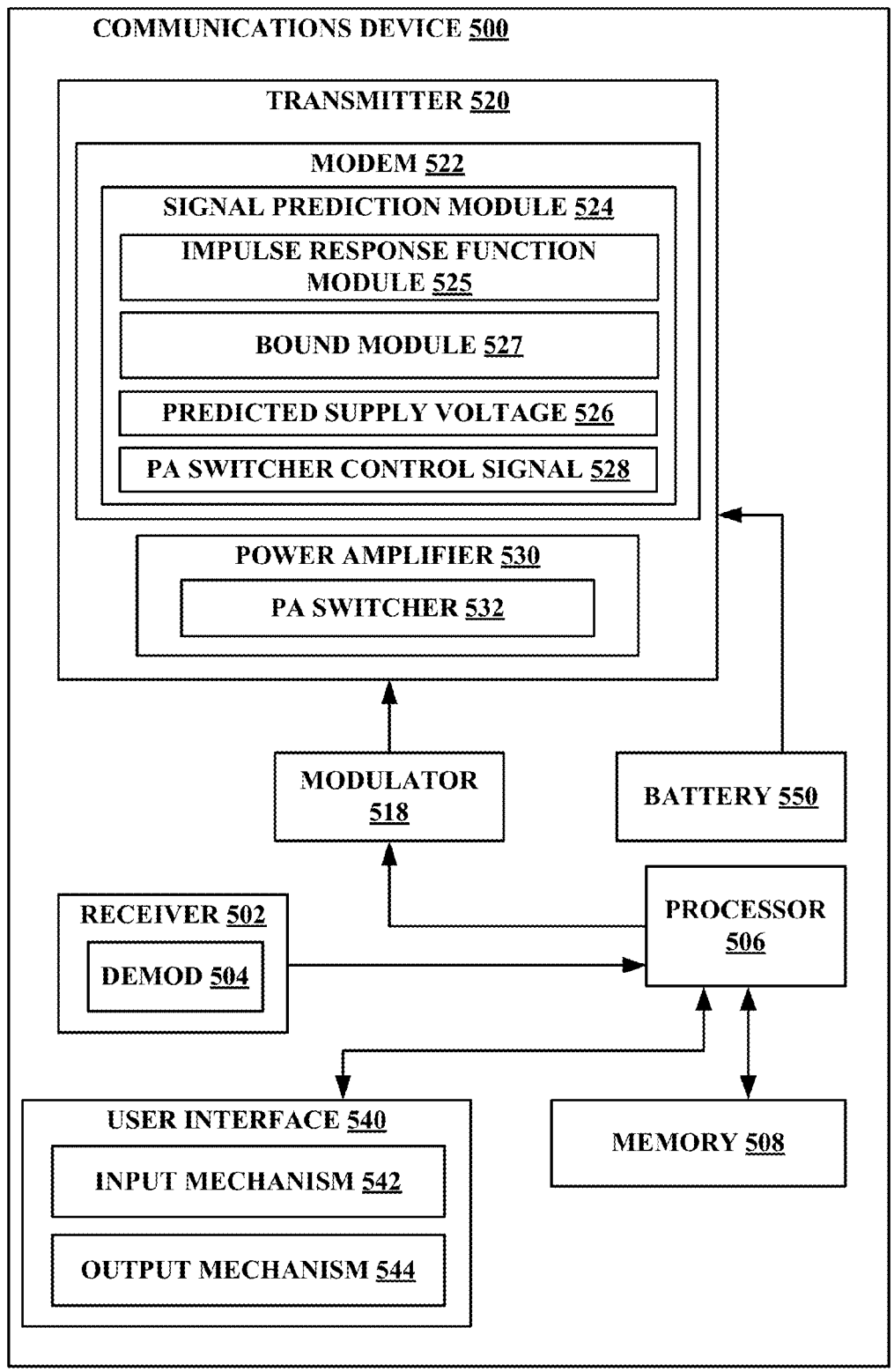
FIG. 5 is a functional block diagram example architecture of a communications device, according to an aspect.

FIG. 5 illustrates an example architecture of communications device 500. As depicted in FIG. 5, communications device 500 includes receiver 502 that receives a signal from, for instance, a receive antenna (not shown), performs typical actions on (e.g., filters, amplifies, downconverts, etc.) the received signal, and digitizes the conditioned signal to obtain samples. Receiver 502 can include a demodulator 504 that can demodulate received symbols and provide them to processor 506 for channel estimation. Processor 506 can be a processor dedicated to analyzing information received by receiver 502 and/or generating information for transmission by transmitter 520, a processor that controls one or more components of communications device 500, and/or a processor that both analyzes information received by receiver 502, generates information for transmission by transmitter 520, and controls one or more components of communications device 500. Further, signals may be prepared for transmission by transmitter 520 through modulator 518 which may modulate the signals processed by processor 506.

Communications device 500 can additionally include memory 508 that is operatively coupled to processor 506 and that can store data to be transmitted, received data, information related to available channels, TCP flows, data associated with analyzed signal and/or interference strength, information related to an assigned channel, power, rate, or the like, and any other suitable information for estimating a channel and communicating via the channel. Communications device 500 can additionally include a power supply (e.g., battery 530, power supply interface, etc.).

Further, at least one of processor 506 or transmitter 520 can provide means for buffering one or more values associated with an input signal, means for predicting a system response to at least a portion of the one or more buffered values, and means for generating a switcher control signal based on the system response.

It will be appreciated that data store (e.g., memory 508) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ES-DRAM), Synchlink DRAM (SLDRAM), and direct Rambus RAM (DRRAM). Memory 508 of the subject systems and methods may comprise, without being limited to, these and any other suitable types of memory.

Communications device 500 transmitter 520 may include modem 522 and power amplifier 530. In an aspect, power amplifier 530 may include a PA switcher 532 that is configured to provide a supply voltage for power amplifier 530 from a ground source path or a battery 550 source path. In an aspect, the PA switcher may receive a PA switcher control signal 528 from the signal prediction module 524 prompting the PA switcher 532 to use either the battery 550 supply path or the ground supply path. In an aspect, modem 522 may include a signal prediction module 524 that may be configured predict various characteristics of an input signal to assist transmitter 520 with efficient signal transmission through power amplifier 530. Signal prediction module 524 may further include impulse response function module 525 and bound module 527. In an aspect, impulse response function module 525 and bound module 527 may be used for modification of and/or comparison with one or more input signal samples. For example, input signal samples may be modified based on one or more impulse response functions to generate an predicted supply voltage 526. In another example, comparison of input signal sample values with one or more bound values may assist signal prediction module 524 in generating the PA switcher control signal 528.

In an operational aspect, signal prediction module 524 may process an input signal that can be characterized by a second order system, as shown in Equation (1) with roots shown in Equation (2).

$$LCs^2 + \frac{L}{R}s + V = 0 \qquad (1)$$

$$s_{1,2} = \alpha \pm j\beta \qquad (2)$$

With reference to the above equations L represents the system conductor value, C represents a system capacitance value, and R represents a system resistance value. A step response can be represented in Equation (3), where a voltage at time "t" can be treated as a state function.

$$\begin{bmatrix} V(t) \\ V'(t) \end{bmatrix} = \begin{bmatrix} \left(\cos\beta t - \frac{\alpha}{\beta}\sin\beta t\right)e^{\alpha t} & \frac{\sin\beta t}{\beta}e^{\alpha t} \\ -\frac{\alpha^2 + \beta^2}{\beta}\sin\beta t e^{\alpha t} & \left(\cos\beta t + \frac{\alpha}{\beta}\sin\beta t\right)e^{\alpha t} \end{bmatrix} \qquad (3)$$

$$\begin{bmatrix} V(0) \\ V'(0) \end{bmatrix} + \begin{bmatrix} 1 - \left(\cos\beta t - \frac{\alpha}{\beta}\sin\beta t\right)e^{\alpha t} \\ \frac{\alpha^2 + \beta^2}{\beta}\sin\beta t e^{\alpha t} \end{bmatrix} V_{bat}$$

Still further, different impulse functions (e.g., g(k) and/or h(k)) may be applied to equation (3) to provide updates to the state functions, as shown in equation (4).

$$\begin{bmatrix} s_1(t+dt) \\ s_2(t+dt) \end{bmatrix} = \begin{bmatrix} \left(\cos\beta dt - \frac{\alpha}{\beta}\sin\beta dt\right)e^{\alpha dt} & \frac{\sin\beta t}{\beta}e^{\alpha dt} \\ -(\alpha^2 + \beta^2)\left(\frac{\sin\beta dt}{\beta}\right)^2 e^{\alpha dt} & \left(\cos\beta dt + \frac{\alpha}{\beta}\sin\beta dt\right)e^{\alpha dt} \end{bmatrix} \qquad (4)$$

$$\begin{bmatrix} s_1(t) - h(W) \\ s_2(t) - g(W) \end{bmatrix} \quad \text{if } V_S(t) = 0$$

$$\begin{bmatrix} s_1(t) - h(W) + h(W+1) \\ s_2(t) - g(W) + g(W+1) \end{bmatrix} \quad \text{if } V_S(t) = 1 \quad +$$

$$\begin{bmatrix} 1 - \left(\cos\beta dt - \frac{\alpha}{\beta}\sin\beta dt\right)e^{\alpha dt} \\ (\alpha^2 + \beta^2)\left(\frac{\sin\beta dt}{\beta}\right)^2 e^{\alpha dt} \end{bmatrix} V_{bat}$$

In equation (4), g(k) is an impulse response function of $$\frac{\sin\beta t}{\beta}$$

to Vs=[Vbat, 0, . . . , 0]. While h(k) is an impulse response function of V(t) to Vs=[Vbat, 0, . . . , 0]. Further description of various interactions within modem 522 is provided above with reference to FIGS. 1 and 2.

Additionally, communications device 500 may include user interface 540. User interface 540 may include input mechanisms 542 for generating inputs into communications device 500, and output mechanism 544 for generating information for consumption by the user of the communications device 500. For example, input mechanism 542 may include a mechanism such as a key or keyboard, a mouse, a touch-screen display, a microphone, etc. Further, for example, output mechanism 544 may include a display, an audio speaker, a haptic feedback mechanism, etc. In the illustrated aspects, the output mechanism 544 may include a display configured to present media content that is in image or video format or an audio speaker to present media content that is in an audio format.

Figure 6:
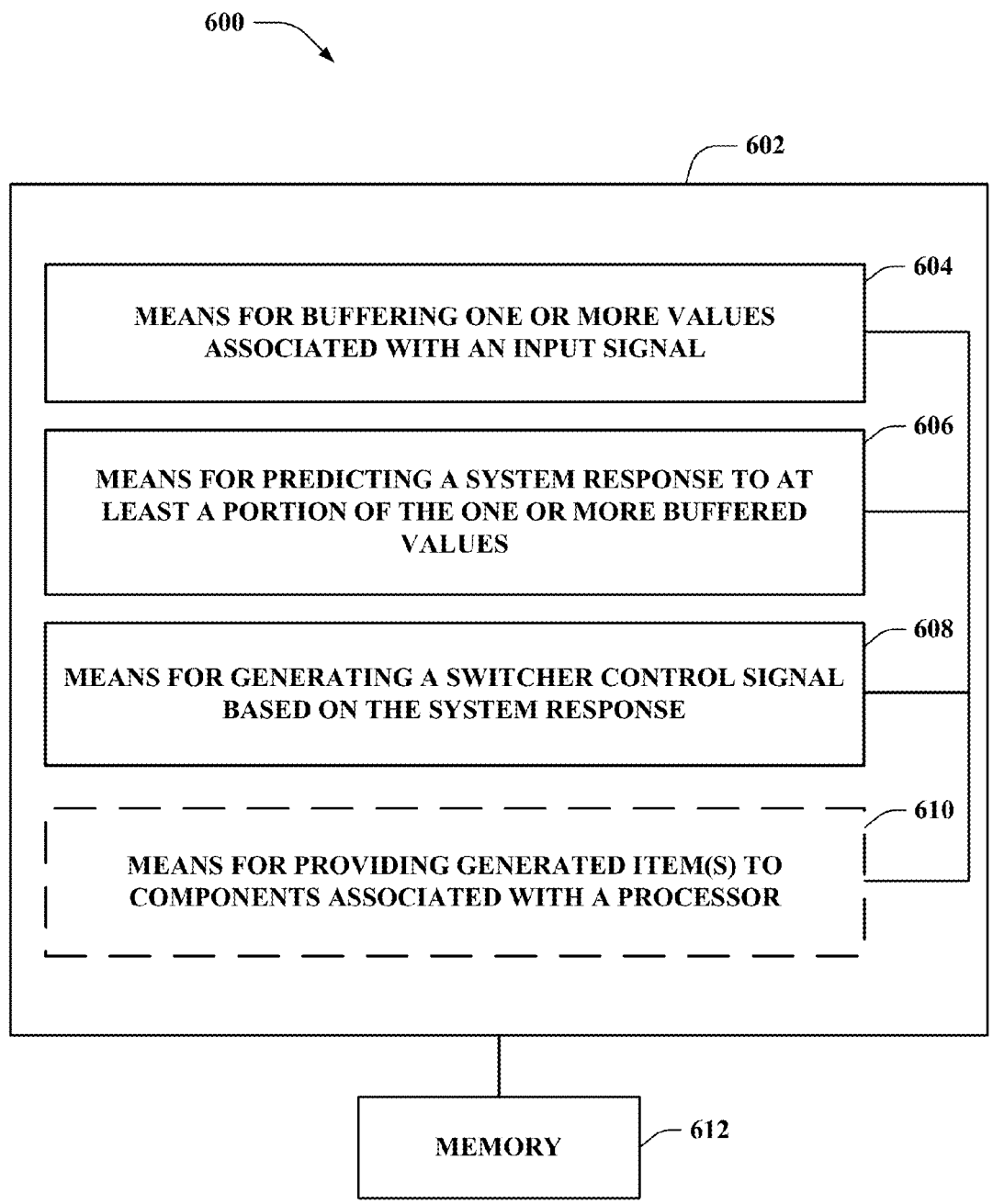
FIG. 6 is a functional block diagram of an example communication system for predicting a control signal for a PA switcher and/or a predicted supply voltage for a digital pre-distortion module, according to an aspect.

Referring to FIG. 6, an apparatus 600 that predicts a control signal for a PA switcher and/or a predicted supply voltage for a digital pre-distortion module can reside at least partially within a transmitter. It is to be appreciated that apparatus 600 is represented as including functional blocks, which can represent functions implemented by a processor, software, or combination thereof (e.g., firmware).

As such, apparatus 600 includes a logical grouping 602 of electrical components that can act in conjunction. For instance, logical grouping 602 can include means for buffering one or more values associated with an input signal (Block 604). In an aspect, the means for buffering 604 may be configured to receive one or more state register values associated with the input signal. In an aspect, the means for buffering 604 may be configured to receive two or more consecutive sample values of the input signal. In another aspect, the means for buffering 604 may be configured to receive a plurality of consecutive sample values sufficient to allow at least one dominant peak to one trough of the input signal to be stored in the buffer. For example, in an aspect, the means 604 can include modem 522 and memory 508 of communications device 500 and/or processor 506 of communications device 500.

Further, logical grouping 602 can include means for predicting a system response to at least a portion of the one or more buffered values (Block 606). In an aspect, the means for predicting 606 may be configured to use an impulse function to generate one or more projected supply voltage values based at least in part on the buffered one or more values associated with the input signal, compare each of the one or more projected supply voltage values with a corresponding bound value, and determine whether any projected supply voltage value of the one or more projected supply voltage values is within a tolerance threshold of the corresponding bound value. For example, in an aspect, the means for using 606 can include modem 522, signal prediction module 524 and/or impulse response function module 525 of communications device 500 and/or processor 506 of communications device 500.

Further, logical grouping 602 can include means for generating a switcher control signal based on the system response (Block 608). In an aspect, the switcher control signal may include a digital bit value prompting a power amplifier switcher to use one or more voltage source paths. In another aspect, the switcher control signal may include a digital bit value prompting a power amplifier switcher to use a ground voltage path. In an aspect, the means for generating 608 may be further configured to generate a predicted supply voltage from the one or more values associated with the input signal. In an aspect, the means for generating 608 may be further configured to use using two or more consecutive sample values of the input signal to generate the predicted supply voltage. For example, in an aspect, the means for generating 608 can include modem 522 and/or signal prediction module 524 of communications device 500 and/or processor 506 of communications device 500.

In an optional aspect, logical grouping 602 can include means for providing one or more generated items to components associated with the processor (Block 610). In an aspect, the processor may be associated with a modem, a RF chip, etc. In an aspect, the means for providing 614 may include means for providing 614 providing the switcher control signal to the power amplifier switcher associated with a power amplifier. In another aspect, the means for providing 614 may include means for providing 614 providing the predicted supply voltage to a predistortion module. For example, in an aspect, the means for providing 614 can include modem 522 and/or signal prediction module 524 of communications device 500 and/or processor 506 of communications device 500.

Additionally, apparatus 600 can include a memory 612 that retains instructions for executing functions associated with electrical components 604, 606, 608, and 610. While shown as being external to memory 612, it is to be understood that one or more of electrical components 604, 606, 608, and 610 can exist within memory 612. In an aspect, for example, memory 612 may be the same as or similar to memory 508 (FIG. 5).

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal A terminal can also be called a system, device, subscriber unit, subscriber station, mobile station, mobile, mobile device, remote station, remote terminal, access terminal, user terminal, terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method of communications, comprising:
buffering one or more values associated with an input signal;
predicting a system response including one or more projected supply voltage values based on applying impulse functions to at least a portion of the one or more buffered values, the impulse functions modifying the one or more buffered values for comparison against a tolerance within a bound value;
when the comparison is within the tolerance, generating a switcher control signal based on the system response; and
configuring a switcher to output a supply voltage based on the switcher control signal.

2. The method of claim 1, wherein the predicting the system response further comprises:
using a response function based on a system configuration to generate the one or more projected supply voltage values, wherein the system includes a low pass filter and a PA;
comparing each of the one or more projected supply voltage values with a corresponding bound value based at least in part on the buffered one or more values associated with the input signal; and
determining whether any projected supply voltage value of the one or more projected supply voltage values is within a tolerance threshold of the corresponding bound value.

3. The method of claim 2, wherein the generating further comprises generating the switcher control signal with a digital bit value prompting a power amplifier switcher to use a voltage source path upon a determination that any of the one or more projected supply voltage values is within the tolerance threshold of the corresponding bound value.

4. The method of claim 2, wherein the generating further comprises generating a switcher control signal with a value prompting the power amplifier switcher to use a ground source path upon a determination that none of the one or more projected supply voltage values are within the tolerance threshold of the corresponding bound value.

5. The method of claim 1, further comprising:
providing the switcher control signal to the power amplifier switcher.

6. The method of claim 1, further comprising tracking a system state through one or more state register values, wherein the system includes a low pass filter and a PA.

7. The method of claim 1, further comprising:
generating a predicted supply voltage from the one or more projected supply voltage values associated with the input signal; and
providing the predicted supply voltage to a predistortion module.

8. The method of claim 7, further comprising receiving a plurality of consecutive sample values sufficient to allow at least one dominant peak to one trough of the input signal to be stored in the buffer.

9. An apparatus comprising:
a buffer configured to store one or more values associated with an input signal;
a reception module configured to buffer the one or more values associated with the input signal;
a prediction module configured to:
predict a system response including one or more projected supply voltage values based on applying impulse functions to at least a portion of the one or more buffered values, the impulse functions modifying the one or more buffered values for comparison against a tolerance within a bound value; and
when the comparison is within the tolerance, generate a switcher control signal based on the system response.

10. The apparatus of claim 9, wherein the prediction module if further configured to:
use a response function based on a system configuration to generate the one or more projected supply voltage values, wherein the system includes a low pass filter and a PA;
compare each of the one or more projected supply voltage values with a corresponding bound value based at least in part on the buffered one or more values associated with the input signal; and
determine whether any projected supply voltage value of the one or more projected supply voltage values is within a tolerance threshold of the corresponding bound value.

11. The apparatus of claim 10, wherein the prediction module if further configured to generate the switcher control signal with a digital bit value prompting a power amplifier switcher to use a voltage source path upon a determination that any of the one or more projected supply voltage values is within the tolerance threshold of the corresponding bound value.

12. The apparatus of claim 10, wherein the prediction module if further configured to generate a switcher control signal with a value prompting the power amplifier switcher to use a ground source path upon a determination that none of the one or more projected supply voltage values are within the tolerance threshold of the corresponding bound value.

13. The apparatus of claim 9, wherein the prediction module if further configured to:
provide the switcher control signal to the power amplifier switcher.

14. The apparatus of claim 9, wherein the reception module if further configured to track a system state through one or more state register values, wherein the system includes a low pass filter and a PA.

15. The apparatus of claim 9, wherein the prediction module if further configured to:
generate an predicted supply voltage from the one or more projected supply voltage values associated with the input signal; and
provide the predicted supply voltage to a predistortion module.

16. The apparatus of claim 15, wherein the reception module if further configured to buffer a plurality of consecutive sample values sufficient to allow at least one dominant peak to one trough of the input signal to be stored in the buffer.

17. An apparatus of communications, comprising:
means for buffering one or more values associated with an input signal;
means for predicting a system response including one or more projected supply voltage values based on applying impulse functions to at least a portion of the one or more buffered values, the impulse functions modifying the one or more buffered values for comparison against a tolerance within a bound value; and
means for generating a switcher control signal based on the system response when the comparison is within the tolerance.

18. The apparatus of claim 17, wherein the means for predicting the system response is configured to:
use a response function based on a system configuration to generate the one or more projected supply voltage values, wherein the system includes a low pass filter and a PA;

compare each of the one or more projected supply voltage values with a corresponding bound value based at least in part on the buffered one or more values associated with the input signal; and determine whether any projected supply voltage value of the one or more projected supply voltage values is within a tolerance threshold of the corresponding bound value.

19. The apparatus of claim 18, wherein the means for predicting the system response is configured to generate the switcher control signal with a digital bit value prompting a power amplifier switcher to use a voltage source path upon a determination that any of the one or more projected supply voltage values is within the tolerance threshold of the corresponding bound value.

20. The apparatus of claim 18, wherein the means for predicting the system response is configured to generate a switcher control signal with a value prompting the power amplifier switcher to use a ground source path upon a determination that none of the one or more projected supply voltage values are within the tolerance threshold of the corresponding bound value.

21. The apparatus of claim 17, further comprising:
means for providing the switcher control signal to the power amplifier switcher.

22. The apparatus of claim 17, wherein the means for buffering is further configured to track a system state through one or more state register values, wherein the system includes a low pass filter and a PA.

23. The apparatus of claim 17, wherein the means for predicting is further configured to:
generate a predicted supply voltage from the one or more projected supply voltage values associated with the input signal; and provide the predicted supply voltage to a predistortion module.

24. The apparatus of claim 23, wherein the means for buffering is further configured to receive a plurality of consecutive sample values sufficient to allow at least one dominant peak to one trough of the input signal to be stored in the buffer.

25. A computer program product comprising:
a non-transitory computer-readable medium comprising code for:
receiving, into a buffer, one or more values associated with an input signal;

predicting a system response including one or more projected supply voltage values based on applying impulse functions to at least a portion of the one or more buffered values, the impulse functions modifying the one or more buffered values for comparison against a tolerance within a bound value; and when the comparison is within the tolerance, generating a switcher control signal based on the system response.

* * * * *